US006815053B2

(12) United States Patent
Inoue et al.

(10) Patent No.: US 6,815,053 B2
(45) Date of Patent: Nov. 9, 2004

(54) LOWLY HEAT-EXPANDABLE LAMINATE

(75) Inventors: Tomoko Inoue, Osaka (JP); Hiroya Okumura, Osaka (JP); Isao Hirata, Osaka (JP); Shigehiro Okada, Osaka (JP)

(73) Assignees: Japan Composite Co., Ltd., Tokyo (JP); Matsushita Electric Works, Ltd., Osaka (JP)

( * ) Notice: Subject to any disclaimer, the term of this patent is extended or adjusted under 35 U.S.C. 154(b) by 136 days.

(21) Appl. No.: 10/221,373

(22) PCT Filed: Mar. 23, 2001

(86) PCT No.: PCT/JP01/02382

§ 371 (c)(1), (2), (4) Date: Jan. 2, 2003

(87) PCT Pub. No.: WO01/72879

PCT Pub. Date: Apr. 10, 2001

(65) Prior Publication Data

US 2004/0096680 A1 May 20, 2004

(30) Foreign Application Priority Data

Mar. 27, 2000 (JP) ....................................... 2000-087329
Mar. 27, 2000 (JP) ....................................... 2000-087330

(51) Int. Cl.[7] .................................................. B32B 5/16

(52) U.S. Cl. .................... 428/323; 428/220; 428/292.1; 428/327; 428/332; 428/359; 428/372; 428/403; 428/401

(58) Field of Search .............................. 428/220, 292.1, 428/297.4, 327, 323, 312.2, 328, 332, 359, 361, 372, 401, 403

(56) References Cited

U.S. PATENT DOCUMENTS 3,549,586 A 12/1970 Comstock et al.
3,936,575 A * 2/1976 Watanabe et al. ........... 428/417
5,830,548 A * 11/1998 Andersen et al. .......... 428/36.4
5,928,767 A 7/1999 Gebhardt et al.
6,352,782 B2 * 3/2002 Yeager et al. ............... 428/461
6,605,343 B1 * 8/2003 Motoi et al. ............. 428/298.1

FOREIGN PATENT DOCUMENTS

| | | |
|---|---|---|
| EP | 217311 | 4/1987 |
| JP | 7-268196 | 10/1995 |
| JP | 8-231654 | 9/1996 |
| JP | 8-259778 | 10/1996 |
| JP | 8-318593 | 12/1996 |
| JP | 2000-80260 | 3/2000 |

* cited by examiner

*Primary Examiner*—Merrick Dixon
(74) *Attorney, Agent, or Firm*—Wenderoth, Lind & Ponack, L.L.P.

(57) ABSTRACT

A low thermal expansion laminated plate which has excellent heat resistance, water resistance and toughness and whose average linear expansion coefficient within the temperature ranging from 40 to 150° C. is not higher than $20\times10^{-6}$/° C. can be obtained by laminating and curing fiber-reinforced layers impregnated with a resin composition consisting of a radically polymerizable resin, radically polymerizable monomer and inorganic filler combined with a specific amount of a thermoplastic resin.

9 Claims, No Drawings

LOWLY HEAT-EXPANDABLE LAMINATE

TECHNICAL FIELD

This application is a 371 of PCT/JP01/02382 filed Mar. 23, 2001.

The present invention relates to a laminated plate having a low thermal expansion and excellent toughness, heat resistance and water resistance, particularly to a composite laminated plate.

BACKGROUND ART

A cured article of a radically polymerizable resin such as unsaturated polyester resins or vinyl ester resins has a well-balanced performance with regard to the mechanical, chemical and electric characteristics, and has been employed widely in the fields of housing, shipping and automobile industries.

However, a cured article of such a radically polymerizable resin, when it is applied to a laminated plate for a print circuit board or a insulating plate while utilizing its excellent heat resistance, water resistance and electric characteristics, poses an insufficiency of the toughness and the impact resistance for the plate and undergoes problematic cracking or delamination between the fiber-reinforced layers during a punching process.

In an attempt to overcome such a problem, a liquid rubber component is added to the resin for enhancement of toughness, but a cured article of the resin containing a rubber component has a high thermal expansion rate, which is not always suitable for a laminated plate used under elevated temperature.

Accordingly, for the purpose of minimizing the thermal expansion rate of a cured article, a method was proposed in which a polymer fine particle is added to a radically polymerizable resin as disclosed in Japanese Patent Application Laid-open No.231654 (1996).

In this method, however, a large amount of the polymer fine particle should be added to the resin in order to obtain a sufficiently reduced thermal expansion. Unfortunately, such addition of the large amount of the polymer fine particle leads to an increase in the viscosity of the resin and the composition thereof, resulting in a new problem, which is a difficulty in producing the resin composition by a conventional method and apparatus.

An objective of the present invention is to provide a laminated plate, especially a composite laminated plate, which is obtained from a resin composition whose main component is a radically polymerizable resin, which has excellent toughness, heat resistance and water resistance, which has such a low thermal expansion rate as a average linear expansion coefficient ($10^{-6}$/° C.) of not higher than 20 within the temperature range from 40 to 150° C., which can be processed and used at an elevated temperature, and which can be produced at a lower cost but can exert a performance comparable with a conventional expensive material such as an epoxy resin.

DISCLOSURE OF INVENTION

We made an effort to solve the problems described above, and discovered that a laminated plate obtained from a resin composition comprising a radical polymerizing resin combined with a specific amount of a thermoplastic resin can solve the problems described above, and then made a further effort to establish the present invention.

Thus, the present invention is:

1. A low thermal expansion laminated plate obtained by curing a laminated material of fiber-reinforced layers impregnated with a thermosetting resin composition comprising (a) a radically polymerizable resin, (b) a thermoplastic resin, (c) a radically polymerizable monomer and (d) an inorganic filler, wherein (a) is present in an amount of 10 to 75 parts by weight, (b) is present in an amount of 2 to 30 parts by weight, (c) is present in an amount of 20 to 60 parts by weight and (d) is present in an amount of 5 to 250 parts by weight, based on 100 parts by weight of the total weight of (a), (b) and (c).

2. A low thermal expansion laminated plate according to the above-mentioned 1 wherein the average linear expansion coefficient of the laminate within the temperature range from 40° C. to 150° C. is not higher than $20\times10^{-6}$/° C.

3. A low thermal expansion laminated plate according to the above-mentioned 1 or 2 wherein the glass transition point of the thermoplastic resin (b) is not higher than 60° C.

4. A low thermal expansion laminated plate according to the above-mentioned 1 or 2 wherein the thermoplastic resin (b) is a saturated polyester resin whose glass transition point is not higher than 60° C.

5. A low thermal expansion laminated plate according to the above-mentioned 1 or 2 wherein the thermoplastic resin (b) is a saturated polyester resin whose glass transition point is not higher than 60° C. and whose number average molecular weight is 2,000 to 100,000.

6. A low thermal expansion laminated plate according to any one of the above-mentioned 1 to 5 further comprising a polymer fine particle (e) whose particle size is 0.1 to 5.0 $\mu$m.

7. A low thermal expansion laminated plate according to any one of the above-mentioned 1 to 6 wherein the laminated material of the fiber-reinforced layers is a composite laminated material comprising as a surface layer a glass fiber woven fabric impregnated with a thermosetting resin composition laminated with an inner lining layer which is a glass fiber non-woven fabric impregnated with a thermoplastic resin composition.

8. A low thermal expansion laminated plate according to any one of the above-mentioned 1 to 7 wherein the radically polymerizable resin (a) is a vinyl ester resin or unsaturated polyester resin.

9. A metal foil-covered laminated plate utilizing a low thermal expansion laminated plate according to any one of the above-mentioned 1 to 8.

While a radically polymerizable resin (a) employed in the present invention is not particularly limited as long as it is a resin having an ethylenically unsaturated bond, those employed preferably are a vinyl ester resins produced by adding ethylenically unsaturated monobasic acid to an epoxy resin and an unsaturated polyester resin produced by a dehydration condensation reaction between a dicarboxylic acid which should contain an $\alpha,\beta$-olefinic unsaturated dicarboxylic acid or an anhydride thereof and a diol.

The epoxy resin as a starting material for a vinyl ester resin may for example be those disclosed in Japanese Patent Application Laid-open No.110948 (1997), such as a bisphenol epoxy resin including bisphenol A and bisphenol F, a novolac epoxy resin including phenol novolac [e.g., YDPN638, produced by TOTO KASEI CO. LTD., epoxy equivalent: 200] and cresol novolac [e.g., YDCN702P, produced by TOTO KASEI CO. LTD., epoxy equivalent: 200], an aliphatic epoxy resin, a nitrogen-containing epoxy resin (e.g., triglycidyl isocyanurate), a copolymeric epoxy resin and the like.

An ethylenically unsaturated monobasic acid may for example be an unsaturated monocarboxylic acid such as (meth)acrylic acid as well as a reaction product between a polybasic acid anhydride and a compound having at least one (meth)acrylic double bond and an alcoholic OH group simultaneously in one molecule.

A compound having at least one (meth)acrylic double bond and an alcoholic OH group simultaneously may for example be a reaction product between hydroxyethyl (meth) acrylate, hydroxypropyl (meth)acrylate, hydroxybutyl (meth)acrylate, pentaerythritol tri (meth)acrylate, glycerin di (meth)acrylate, (meth) acrylic acid and a polyhydric alcohol. Among those listed above, (meth)acrylic acid is preferred.

The reaction between an epoxy resin and an ethylenically unsaturated monobasic acid described above may be conducted by a known method. For example, the reaction is conducted at 80 to 150° C. for 1 to 20 hours in the presence of a polymerization inhibitor such as hydroquinone and a catalyst such as a tertiary amine e.g., benzyldimethylamine or a phosphorus compound e.g., triphenylphosphine, whereby obtaining an intended vinyl ester resin.

While the reaction between the epoxy group and the carboxyl group in the vinyl estrification reaction is a 1 to 1 equivalent reaction, the synthesis may sometimes be conducted also with an excess of the epoxy group or with an excess of the carboxyl group.

An unsaturated polyester resin employed in the present invention can be synthesized by condensation between an α,β-olefinic unsaturated dicarboxylic acid and a glycol. In addition to these two components, a saturated dicarboxylic acid, aromatic dicarboxylic acid or dicyclopentadiene capable of reacting with a dicarboxylic acid may also be employed in the synthesis of the unsaturated polyester resin.

An α,β-olefinic unsaturated dicarboxylic acid may for example be maleic acid, fumaric acid, itaconic acid, citraconic acid and anhydrides of these dicarboxylic acids. A dicarboxylic acid capable of being used together with such an α,β-olefinic unsaturated dicarboxylic acid may for example be adipic acid, sebacic acid, succinic acid, gluconic acid, o-, m-, p-phthalic acid, tetrahydrophthalic acid, hexahydrophthalic acid and the like.

A glycol may for example be an alkane diol, oxa-alkane diol, a diol obtained by adding an alkylene oxide such as ethylene oxide or propylene oxide to bisphenol A. In addition, a monohydric or trihydric alcohol may also be employed. An alkane diol may for example be ethylene glycol, 1,2-propylene glycol, 1,3-propylene glycol, 1,3-butanediol, 1,4-butanediol, neopentyl glycol, 1,5-pentanediol, 1,6-hexanediol, cyclohexanediol, hydrogenated bisphenol A and the like. An oxa-alkane diol may for example be dioxyethylene glycol and triethylene glycol. A monohydric or trihydric alcohol used together with the glycols mentioned above may for example be octylalcohol, benzylalcohol, trimetylolpropane and the like.

The synthesis of an unsaturated polyester resin is conducted generally under heating, while water generated as a by-product being removed. Generally, the Tg of an unsaturated polyester resin can be lowered by selecting starting materials to reduce the crosslink density and the reactivity of the resin, or by starting from adipic acid or sebacic acid as a saturated acid and diethylene glycol or dipropylene glycol as a glycol, those have a long chain molecular structure. On the contrary, the Tg of the resin can be elevated by selecting starting material to increase the crosslink density or the reactivity of a resin or by starting from hydrogenated bisphenol A as a glycol which has a rigid structure.

The amount of a radically polymerizable resin (a) to be used is usually 10 to 75 parts by weight, preferably 30 to 67 parts by weight based on the total weight of the components (a), (b) and (c) being regarded as 100 parts by weight.

The amount of a thermoplastic resin (b) employed in the present invention may for example be a thermoplastic resin used customarily as a low profile agent in an unsaturated polyester resin. Such a thermoplastic resin may for example be polybutadiene or a hydrogenated derivative thereof, polyisoprene or a hydrogenated derivative thereof, aromatic vinyl/conjugated diene block copolymer or a hydrogenated derivative thereof, polystyrene, styrene/vinyl acetate block copolymer, polyvinyl acetate, polymethyl methacrylate, as well as a saturated polyester resin, polyether resin and the like. Among those listed above, an aromatic vinyl/conjugated diene block copolymer and saturated polyester resin are preferred, with a saturated polyester resin being particularly preferred.

While the saturated polyester resin as a thermoplastic resin is not limited particularly, it preferably has a Tg of 60° C. or lower, more preferably 50° C. or lower. A Tg of the saturated polyester resin higher than 60° C. may be led to a difficulty in reducing the thermal expansion rate of a cured article sufficiently.

A saturated polyester resin may typically be those employed as single component anti-shrinkage agents for SMC and the like, for example, those synthesized from a dicarboxylic acid such as terephthalic acid, isophthalic acid, succinic acid, adipic acid, sebacic acid, azelaic acid and the like and a diol such as ethylene glycol, propylene glycol, neopentyl glycol, 1,6-hexandiol, diethylene glycol, dipropylene glycol, and the like.

While the molecular weight of a saturated polyester resin is not limited particularly, the number average molecular weight is usually 2,000 to 100,000, preferably 3,000 to 30,000, since a too lower molecular weight leads to a reduced heat resistance while a too higher molecular weight leads to a high viscosity.

A saturated polyester resin may for example be TTK-101 (produced by TAKEDA CHEMICAL INDUSTRIES LTD.) and BYLON 300, 630, 550 (produced by TOYOBO CO., LTD.).

An aromatic vinyl/conjugated diene block copolymer is also a preferred example of the thermoplastic resin (b).

An aromatic vinyl/conjugated diene block copolymer may be a block copolymer known per se, and can be synthesized by block copolymerizing an aromatic vinyl monomer such as styrene, chlorostyrene and vinyl toluene with a conjugated diene monomer such as butadiene and isoprene by a conventional polymerization method. Such a block copolymer may for example be styrene/isoprene block copolymer. Such a block copolymer has a molar ratio of an aromatic vinyl monomer and a conjugated diene monomer of about 50:50 to 5:95 and an average molecular weight of about 30,000 to 200,000.

The amount of a thermoplastic resin (b) to be incorporated is usually 2 to 30 parts by weight, preferably 2 to 20 parts by weight based on the total weight of the components (a), (b) and (c) being regarded as 100 parts by weight.

A radically polymerizable monomer (c) may for example be an unsaturated fatty acid such as acrylic acid and methacrylic acid, an unsaturated carboxylate such as methyl methacrylate, ethyl methacrylate, propyl methacrylate, butyl methacrylate, 2-ethylhexyl methacrylate, glycidyl methacrylate, 2-hydroxtethyl methacrylate, methyl acrylate, ethyl acrylate, propyl acrylate, butyl acrylate, 2-ethylhexyl acrylate and dodecyl acrylate, a nitrogen-containing monomer such as (meth)acrylamide and (meth)acrylonitrile, an aromatic vinyl compound such as styrene, vinyltoluene, divinylbenzene and p-t-butylstyrene and a polyfunctional (meth)acrylate such as ethylene glycol di(meth)acrylate, diethylene glycol di(meth)acrylate, 1,4-butanediol di(meth) acrylate, 1,6-hexanediol di(meth)acrylate, trimethylolpropane tri(meth)acrylate, pentaerythritol tri(meth)acrylate and pentaerythritol tetra(meth)acrylate, any of which may be employed alone or in combination with each other. Among those listed above, styrene is particularly preferred.

The amount of a radically polymerizable monomer (c) to be incorporated is usually 20 to 60 parts by weight, preferably 25 to 55 parts by weight based on the total weight of the components (a), (b) and (c) being regarded as 100 parts by weight.

An inorganic filler (d) employed in a thermosetting resin composition of the present invention may for example be aluminium hydroxide, glass powder, calcium carbonate, talc, silica, clay, glass balloon and the like. These may be used in an amount usually of 5 to 250 parts by weight, preferably 5 to 200 parts by weight, based on the total weight of the components (a), (b) and (c) being regarded as 100 parts by weight.

The toughness and the low thermal expansion performance of a laminated plate can further be improved by incorporating a polymer fine particle (e) to a thermosetting resin composition employed in the present invention.

A polymer fine particle (e) preferably has a multilayer structure, although a monolayer particle may also be employed. Such a multilayer polymer fine particle can be obtained by a consecutive multi-stage emulsion polymerization in which, in the presence of the preceding stage polymer, the subsequent stage monomer is subjected sequentially to seed polymerization, as is disclosed in JP-A-8-48704. That is, seed latex is first prepared by emulsion polymerization, then a monomer for forming the first layer is added and subjected to the seed polymerization. Subsequently, a monomer for forming the second layer is added and subjected to the seed polymerization whereby synthesizing the second layer, and this procedure is repeated until the outermost layer is synthesized, whereby obtaining an intended multilayer-structured polymer.

A reactive unsaturated monomer employed in the seed polymerization of a polymer layer of a polymer fine particle (e) employed in the present invention may be any monomer having in the molecule thereof at least one reactive unsaturated bond, including a conjugated diene such as butadiene, isoprene and chloroprene, an alkyl acrylate such as ethyl acrylate, propyl acrylate, butyl acrylate, cyclohexyl acrylate, isononyl acrylate and 2-ethylhexyl acrylate and an alkyl methacrylate such as methyl methacrylate, ethyl methacrylate and cyclohexyl methacrylate. Any of these may be copolymerized with a monomer capable of being copolymerized with it, for example, an aromatic vinyl or aromatic vinylidene such as styrene, vinyltoluene and α-methylstyrene, a vinyl cyanide or vinylidene cyanide such as acrylonitrile and methacrylonitrile, an alkyl methacrylate such as methyl methacrylate and butyl methacrylate and an aromatic (meth) acrylate such as benzyl acrylate and phenoxyethyl acrylate.

In the polymerization of a polymer layer of a polymer fine particle, a specific amount of a crosslinking monomer and grafting monomer can be employed as a copolymeric monomer in addition to the monomers described above. The crosslinking monomer may be employed in an amount of 0.1 to 10% by weight, preferably 0.2 to 5% by weight based on the monomers forming the polymer, while the grafting monomer may be employed in an amount of 0.1 to 10% by weight, preferably 0.2 to 5% by weight based on the monomers forming the polymer layer.

A crosslinking monomer employed in the present invention is one having in its molecule at least two similar polymerizable groups, including an aromatic divinyl compound such as divinylbenzene and an alkane polyol polyacrylate or alkane polyol polymethacrylate such as ethylene glycol diacrylate, ethylene glycol dimethacrylate, butylene glycol diacrylate, butylene glycol dimethacrylate, hexanediol diacrylate, hexanediol dimethacrylate, oligoethylene glycol diacrylate, oligoethylene glycol dimetacrylate, trimethylolpropane diacrylate, trimethylolpropane triacrylate and trimethylolpropane trimethacrylate. Among those listed above, butylene glycol diacrylate and hexanediol diacrylate are particularly preferred.

A grafting monomer employed in the present invention has at least two polymerizable groups having a different reactivity from each other in its molecule, for example an unsaturated carboxylic acid allyl ester such as allyl acrylate, allyl methacrylate, diallyl maleate, diallyl fumarate and diallyl itaconate. Among those mentioned above, allyl methacrylate is particularly preferred.

A polymer fine particle (e) employed in the present invention can serve to further improve the toughness of a resin composition by modifying the outermost layer with a carboxyl group- or hydroxy group-carrying monomer.

A carboxyl group-carrying monomer may for example be acrylic acid, methacrylic acid, maleic acid and itaconic acid. A hydroxy group-carrying monomer may for example be 2-hydroxyethyl (meth)acrylate, 2-hydroxypropyl (meth) acrylate and 2-hydroxybutyl (meth)acrylate. Among those described above, methacrylic acid is a preferred carboxyl group-carrying monomer, while 2-hydroxyethyl methacrylate is a preferred hydroxyl group-carrying monomer.

The amount of such a functional group-carrying monomer is less than 10% by weight, preferably less than 5% by weight based on the monomers forming the outermost layer. An amount of the functional group carrying monomer exceeding the range specified above may lead to a reduced dispersibility in the resin, resulting in an increased viscosity of a resin composition or a poor appearance or mechanical property of a cured article.

A polymer fine particle (e) employed in the present invention has, as at least one inner layer, a polymer layer having a Tg not higher than 20° C., which exists in an amount of 50 to 95% by weight, preferably 70 to 90% by weight, based on the entire of a miltilayer-structured polymer. An amount of the polymer layer having a Tg not higher than 20° C. less than the level specified above may lead to an insufficiently improved toughness or low thermal expansion performance of a resin composition, while an amount exceeding the level specified above may lead to a reduced dispersibility in the resin, resulting in an increased viscosity of a resin composition or a poor appearance or mechanical property of a hardened article.

A polymer fine particle (e) of the present invention preferably has the outermost layer whose Tg is 40° C. or higher. Absence of such an outermost layer makes it difficult to effect dispersion in the resin and to reduce the viscosity.

The particle size of a polymer fine particle (e) thus polymerized is usually 0.1 to 5.0 $\mu$m, preferably 0.2 to 2.0 $\mu$m. A smaller particle size may increase the viscosity of a resin composition, and resulted in poor productivity of the resin, or insufficient improvement of the low thermal expansion performance. On the contrary, a larger particle size may lead to an insufficient toughness. The particle size means a weight average particle size of a single particle of a multilayer-structured polymer in the state of a latex during the production of the multilayer-structured polymer, and can be measured by a dynamic light scattering method using a dynamic light scattering meter (for example, LPA-3000/LPA-3100, produced by OTSUKA DENSHI KK).

A polymer fine particle (e) of the present invention can be used in such a manner that a polymer latex polymerized by a method described above is once frozen and then thawed to separate the polymer particles and then centrifuged for dehydration and then dried and the resultant powder is dispersed in a mixture of resins (a) and (c), or it can be mixed in such a manner that the latex itself is placed in the starting material of the component (a) and the water is distilled off and then the component (a) is synthesized.

The amount of a polymer fine particle (e) employed in the present invention is usually 0.1 to 15 parts by weight, preferably 0.5 to 10 parts by weight, based on the total weight of the components (a), (b) and (c) being regarded as 100 parts by weight.

A curing agent is employed for curing a resin composition of the present invention.

Such a curing agent employed in the present invention may for example be organic peroxide such as methyl ethyl ketone peroxide, t-butyl peroxybenzoate, benzoyl peroxide, dicumyl peroxide and cumene hydroperoxide. The amount of a curing agent used is preferably 0.1 to 3 parts by weight based on the total weight of the components (a), (b) and (c) being regarded as 100 parts by weight. The Tg of a cured article obtained from a resin composition comprising such components (a), (b) and (c) is preferably 120° C. or higher, more preferably 135° C. or higher.

A fiber-reinforced layers impregnated with a thermosetting resin composition comprising the components (a), (b), (c) and (d) according to the present invention may be of any material employed conventionally for a laminated plate such as a glass non-woven fabric, glass woven fabric and paper substrate.

A laminated plate of the present invention can be obtained by overlaying three or more of fiber-reinforced layers impregnated with a thermosetting resin composition containing a curing agent to form a laminated material, covering the both sides if necessary with a metal foil such as a copper foil, and then curing the laminated material with heating and pressurizing.

A particularly preferred embodiment of the present invention is a combined laminated plate having as a impregnation substrate a glass fiber woven fabric, glass fiber non-woven fabric and paper substrate, namely, a composite laminated plate. A composite laminated plate of the present invention obtained by curing and pressurizing a composite laminated material in which a glass fiber woven fabric impregnated with a thermosetting resin composition including the components (a), (b), (c) and (d) described above wherein the component (a) is present in an amount of 10 to 75 parts by weight, the component (b) is present in an amount of 2 to 30 parts by weight, the component (c) is present in an amount of 20 to 60 parts by weight and the component (d) is present in an amount of 5 to 250 parts by weight, based on the total weight of the components (a), (b) and (c) being regarded as 100 parts by weight as a surface layer is laminated with a glass fiber non-woven fabric impregnated with a thermosetting resin composition comprising the components (a), (b), (c) and (d) described above wherein the component (a) is present in an amount of 10 to 75 parts by weight, the component (b) is present in an amount of 2 to 30 parts by weight, the component (c) is present in an amount of 20 to 60 parts by weight and the component (d) is present in an amount of 5 to 250 parts by weight, based on the total weight of the components (a), (b) and (c) being regarded as 100 parts by weight as an inner layer has excellent heat resistance, water resistance and toughness, and is extremely useful for a print circuit board.

The linear expansion coefficient of a laminated plate of the present invention was measured by a thermal analyzer, and was a larger one of the vertical and lateral linear expansion coefficients of the laminated plate.

When the Tg of a cured article obtained from a thermosetting resin composition comprising the components (a), (b), (c) and (d) employed in the present invention is 120° C. or higher, then a laminated plate having an extremely high heat resistance can be obtained. With an inventive laminated plate whose average linear expansion coefficient within the temperature range from 40 to 150° C. is not higher than $20.0\times10^{-6}$/° C., a low liner expansion coefficient which has not been achieved by a laminated plate employing a conventional radically polymerizable resin composition can be obtained for the first time.

Since a laminated plate of the present invention has excellent heat resistance and water resistance, exhibits a satisfactory punching performance, and has a low thermal expansion coefficient, it is applicable also to a use at a high temperature, such as in an automobile, to which a laminated plate made from a conventional liquid rubber component-containing thermosetting resin composition is not applicable.

BEST MODE FOR CARRYING OUT THE INVENTION

The present invention is further described in the following Synthetic Examples, Examples, Comparative Examples and Experiments, which are not intended to restrict the present invention.

SYNTHETIC EXAMPLE 1

Synthesis of Radically Polymerizable Resin

In a 2-L 4-necked flask equipped with a stirrer and a thermometer, 172 g of acrylic acid was added to 800 g of an epoxy resin (YDB-400, TOTO KASEI CO. LTD., epoxy equivalent: 400) was combined with 172 g of methacrylic acid in the presence of 0.3 g of hydroquinone and 0.3 g of benzyldimethylamine, and reacted at 120° C. for 6 hours to obtain a vinyl ester resin whose acid value was 2.0 mg KOH/g. Subsequently, 457 g of styrene monomer was added to obtain a vinyl ester resin (A-1) [NV (non-volatiles)=68%].

SYNTHETIC EXAMPLE 2

Synthesis of Radically Polymerizable Resin

In a 1-L 4-necked flask equipped with a stirrer and a thermometer, 374 g of an epoxy resin (YD-128, TOTO KASEI CO. LTD., epoxy equivalent: 187) was combined with 172 g of methacrylic acid in the presence of 0.3 g of hydroquinone and 0.3 g of benzyldimethylamine, and reacted at 120° C. for 6 hours to obtain a vinyl ester resin whose acid value was 2.0 mg KOH/g. Subsequently, 294 g of styrene monomer was added to obtain a vinyl ester resin (A2) (NV=65%).

SYNTHETIC EXAMPLE 3

Synthesis of Radically Polymerizable Resin

A 2-L 5-necked flask equipped with a stirrer, a thermometer, a nitrogen gas introducing tube and a condenser whose top was equipped with a thermometer was charged with 392 g of maleic anhydride, 141 g of propylene glycol and 0.07 g of hydroquinone, and was purged with nitrogen gas and subjected to dehydration condensation at 200° C. for 7 hours to obtain an unsaturated polyester resin whose acid value was 20.4 mg KOH/g. Subsequently, 649 g of styrene monomer was added to obtain an unsaturated polyester resin (A-3) (NV=48%).

SYNTHETIC EXAMPLE 4

Synthesis of Radically Polymerizable Resin

A 2-L 5-necked flask equipped with a stirrer, a thermometer, a nitrogen gas introducing tube and a condenser whose top was equipped with a thermometer was charged with 392 g of maleic anhydride, 239 g of propylene glycol, 141 g of dipropylene glycol and 0.07 g of hydroquinone, and was purged with nitrogen gas and subjected to dehydration condensation at 200° C. for 7 hours to obtain an unsaturated polyester resin whose acid value was 20.4 mg KOH/g. Subsequently, 649 g of styrene monomer was added to obtain an unsaturated polyester resin (A-4) (NV=48%).

SYNTHETIC EXAMPLE 5

Synthesis of Radically Polymerizable Resin

In a 3-L 4-necked flask equipped with a stirrer and a thermometer, 374 g of an epoxy resin (YD-128, TOTO KASEI CO. LTD., epoxy equivalent: 187) was combined with 971 g of a liquid rubber (CTBN, 1300×8, B.Goodrich) in the presence of 0.3 g of hydroquinone and 0.3 g of benzyldimethylamine, and reacted at 120° C. for 3 hours to obtain a rubber-modified epoxy resin whose acid value was 0.2 mg KOH/g and whose epoxy equivalent was 879. Then, 121 g of methacrylic acid was added and reacted at 120° C. for further 5 hours to obtain a rubber-modified vinyl ester resin whose acid value was 0.9 mg KOH/g. Subsequently, 977 g of styrene monomer was added to obtain a rubber-modified vinyl ester resin (A-5) (NV=60%.

SYNTHETIC EXAMPLE 6

Synthesis of Saturated Polyester Resin

A 1-L 5-necked flask equipped with a stirrer, a thermometer, a nitrogen gas introducing tube and a condenser whose top was equipped with a thermometer was charged with 438 g of adipic acid, 96 g of propylene glycol and 117 g of ethylene glycol, and was purged with nitrogen gas. The mixture was subjected to dehydration condensation at 200° C. for 8 hours to obtain a saturated polyester resin whose acid value was 4.6 mg KOH/g (B-1). The Tg and the number average molecular weigh of this resin were 42° C. and 24,400, respectively.

SYNTHETIC EXAMPLE 7

Synthesis of Saturated Polyester Resin

A 1-L 5-necked flask equipped with a stirrer, a thermometer, a nitrogen gas introducing tube and a condenser whose top was equipped with a thermometer was charged with 233 g of terephthalic acid, 113 g of azelaic acid, 65 g of ethylene glycol and 106 g of neopentyl glycol, and was purged with nitrogen. The mixture was subjected to dehydration condensation at 240° C. for 10 hours to obtain a saturated polyester resin whose acid value was 1.4 mg KOH/g (B-2). The Tg and the number average molecular weigh of this resin were 7° C. and 26900, respectively.

SYNTHETIC EXAMPLE 8

Synthesis of Saturated Polyester Resin

A 1-L 5-necked flask equipped with a stirrer, a thermometer, a nitrogen gas introducing tube and a condenser whose top was equipped with a thermometer was charged with 100 g of terephthalic acid, 66 g of isophthalic acid, 188 g of azelaic acid, 72 g of ethylene glycol and 96 g of neopentyl glycol, and was purged with nitrogen gas. The mixture was subjected to dehydration condensation at 240° C. for 9 hours to obtain a saturated polyester resin whose acid value was 1.0 mg KOH/g (B-3). The Tg and the number average molecular weigh of this resin were −20° C. and 23900, respectively.

SYNTHETIC EXAMPLE 9

Synthesis of Fine Particle of Multilayer-Structured Polymer

A 2-L g reactor for polymerization equipped with a condenser was charged with 506 g of deionized water, 2.4 g of a 1% aqueous solution of sodium dioctylsulfosuccinate and 16.4 g of a 1% aqueous solution of sodium hydrogen carbonate, and heated at 70° C. with stirring under a nitrogen stream. At elevated temperature, 8 g of ethyl acrylate was added and the mixture was stirred for 10 minutes, combined with 4.1 g of a 2% aqueous solution of sodium persulfate, and stirred for further 1 hour to obtain a seed latex. Subsequently, 51 g of a 2% aqueous solution of sodium persulfate was added at 70° C., and then a monomer emulsion for forming the first layer consisting of 663 g of butyl acrylate, 2.4 g of 1,4-butylene glycol diacrylate, 6.7 g of allyl methacrylate, 408 g of a 1% aqueous solution of sodium dioctylsulfosuccinate and 68 g of a 1% aqueous solution of sodium hydrogen carbonate was fed continuously over a period of 240 minutes. After feeding, the mixture was stirred further for 60 minutes at 70° C., for aging the reaction mixture. Then, to the mixture which was still kept at 70° C., a monomer emulsion for forming the outermost layer consisting of 7.2 g of a 2% aqueous solution of sodium persulfate was added followed by 101 g of methyl methacrylate, 12 g of ethyl acrylate, 0.6 g of 2-hydroxyethyl methacrylate, 6 g of 1,4-butylene glycol diacrylate, 60 g of a 1% aqueous solution of sodium dioctylsulfosuccinate and 12 g of a 1% sodium hydrogen carbonate was fed continuously over a period of 90 minutes. After feeding, the mixture was heated further to 80° C., and stirred for 60 minutes for aging the reaction mixture. After the maturing reaction, the mixture was filtered through a 300-mesh stainless steel wire mesh to obtain a multilayer-structured polymer latex whose weight average particle size was 0.5 $\mu$m. This latex was frozen once at −30° C., and then thawed, dehydrated and washed with a centrifuging dehydrator, and dried overnight at 40° C. under an air stream, whereby obtaining a multilayer-structured polymer fine particle (B-4).

EXAMPLES 1 TO 6 AND COMPARATIVE EXAMPLES 1 AND 2

The radically polymerizable resins (A-1) to (A-5) obtained in Synthetic Examples 1 to 5 in the amounts specified in Table 1, which were warmed at 80° C., were combined with the saturated polyester resins (B-1) to (B-3) and the polymer fine particle (B-4) obtained in Synthetic Examples 6 to 9, and dissolution was effected at 80° C. over a period of 3 hours, whereby obtaining thermosetting resin compositions. 100 Parts by weight of each of the thermosetting resin compositions thus obtained was mixed with 40 parts by weight of aluminium hydroxide (CL-310, SUMITOMO CHEMICAL CO. LTD.) and 1.0 parts by weight of 80% cumene hydroperoxide (PARKMIL H-80, NOF CORPORATION) to form Compound (1), or mixed with 140 parts by weight of aluminium hydroxide and 1.0 parts by weight of 80% cumene hydroperoxide to form Compound (2).

One layer of a glass fiber woven fabric for a laminated plate (WE-18K-BS, NITTO BOSEKI CO.) impregnated with Compound (1), three layers of a glass fiber non-woven fabric (Ep-4060, 60 g/m$^2$, JAPAN VILENE CO., LTD.) impregnated with Compound (2) and one layer of a glass fiber woven fabric (WE-18K-BS, NITTO BOSEKI CO.) impregnated with Compound (1) were laminated in this order, and cured at 100° C. for 30 minutes under pressure and 175° C. for 30 minutes to obtain a laminated plate with dimension of 150×150×1.6 mm.

Experiment 1

Each laminated plate obtained in Examples and Comparatives was examined for the items listed below, and the physical parameters obtained are indicated in Table 1 together with its starting materials of the resin.

(1) Pressure Cooker Test (PCT)

Sample: Laminated plate cut into a size of 40 mm×40 mm piece

Condition: 121° C.×95% RH×60 minutes

% Water absorption: Calculated as follows:

% Water absorption=(Post-PCT weight-initial weight)/Initial weight×100

260° C. solder heat resistance test: Post-PCT sample was immersed in a molten solder bath (260±5° C.) and the time period (sec) until a blister was formed was recorded.

(2) Linear Expansion Coefficient (Hereinafter Abbreviated as "α") measurement

A laminated plate was measured in the vertical and lateral directions and the value giving a larger a was selected.

Sample: Plate of glass fiber woven fabric cut into a 3 mm×15 mm

Instrument: Thermal analyzer (5 g load, elevated by 5° C./min, measured from 20 to 200° C., average linear expansion coefficient from 40 to 150° C.)

(3) Punching Performance

In accordance with ASTM D617

Evaluation:

Excellent: ○

Good: Δ

Acceptable: x

TABLE 1

| | | | Examples | | | | | | Comparative Examples | |
|---|---|---|---|---|---|---|---|---|---|---|
| | | | 1 | 2 | 3 | 4 | 5 | 6 | 1 | 2 |
| Radically polymerizable resin (% by weight) | A-1 | | 50 | 50 | 15 | 50 | 50 | 50 | 50 | 50 |
| | A-2 | | 15.3 | 15.3 | 31.4 | | 13 | 12 | 15.3 | |
| | A-3 | | 15 | 18 | | 40 | | | 30 | 20 |
| | A-4 | | | | | | 18 | 15 | | |
| | A-5 | | | | | | | | | 30 |
| Styrene monomer (% by weight) | | | 4.7 | 4.7 | 9.6 | | | | 4.7 | |
| Thermoplastic resin (% by weight) | Saturated polyester resin | B-1 | 15 | | | | | 10 | | |
| | | B-2 | | 12 | | 10 | 12 | | | |
| | | B-3 | | | 9 | | | | | |
| | Polymer fine particle | B-4 | | | | | 2 | 5 | | |
| PCT | Water absorption (%) | | 0.28 | 0.25 | 0.24 | 0.26 | 0.24 | 0.21 | 0.36 | 0.30 |
| | 260° C. Solder heat resistance (sec) | | >180 | >180 | >180 | >180 | >180 | >180 | >180 | >180 |
| Linear expansion coefficient α ($10^{-6}$/° C.) | | | 187 | 15.2 | 19.0 | 17.6 | 16.0 | 19.6 | 30.5 | 25.4 |
| Punching performance | | | ○ | ○ | ○ | ○ | ○ | ○ | ○ | X |

As evident from Table 1, the linear expansion coefficient α ($10^{-6}$/° C.) of each inventive laminated plate was as low as 20 or less, while that of Comparative 1 or 2 employing no saturated polyester resin was as high as 25. The punching performance of each laminated plate of Examples was also markedly excellent when compared with Comparatives.

INDUSTRIAL APPLICABILITY

A laminated plate of the present invention has excellent heat resistance, water resistance and punching performance, can satisfactorily be used even with heating especially when it has a linear expansion coefficient within the temperature range from 40 to 150° C. of not higher than $20.0\times10^{-6}$/° C. It can be obtained at a low cost, when compared with a laminated plate made by a conventional method for example from an epoxy resin, without any deterioration in the quality of the final product when compared with a conventional product.

What is claimed is:

1. A low thermal expansion laminated plate obtained by curing a laminated material of fiber-reinforced layers impregnated with a thermosetting resin composition comprising a radically polymerizable resin (a), a thermoplastic resin (b), a radically polymerizable monomer (c) and an inorganic filler (d), wherein (a) is present in an amount of 10 to 75 parts by weight, (b) is present in an amount of 2 to 30 parts by weight, (c) is present in an amount of 20 to 60 parts by weight and (d) is present in an amount of 5 to 250 parts by weight, based on 100 parts by weight of the total weight of (a), (b) and (c).

2. A low thermal expansion laminated plate according to claim 1 wherein the average linear expansion coefficient of the laminate within the temperature ranging from 40° C. to 150° C. is not higher than $20\times10^{-6}$/° C.

3. A low thermal expansion laminated plate according to claim 1 wherein the glass transition point of the thermoplastic resin (b) is not higher than 60° C.

4. A low thermal expansion laminated plate according to claim 1 wherein the thermoplastic resin (b) is a saturated polyester resin whose glass transition point is not higher than 60° C.

5. A low thermal expansion laminated plate according to claim 1 wherein the thermoplastic resin (b) is a saturated polyester resin whose glass transition point is not higher than 60° C. and whose number average molecular weight is 2,000 to 100,000.

6. A low thermal expansion laminated plate according to claim 1 further comprising a polymer fine particle (e) whose particle size is 0.1 to 5.0 μm.

7. A low thermal expansion laminated plate according to claim 1 wherein the laminated material of the fiber-reinforced layers is a composite laminated material comprising as a surface layer a glass fiber woven fabric impregnated with a thermosetting resin composition laminated with an inner lining layer which is a glass fiber non-woven fabric impregnated with a thermoplastic resin composition.

8. A low thermal expansion laminated plate according to claim 1 wherein the radically polymerizable resin (a) is a vinyl ester resin or unsaturated polyester resin.

9. A metal foil-covered laminated plate utilizing a low thermal expansion laminated plate according to claim 1.

* * * * *